United States Patent [19]
Sandhu

[11] Patent Number: 6,084,302
[45] Date of Patent: Jul. 4, 2000

[54] BARRIER LAYER CLADDING AROUND COPPER INTERCONNECT LINES

[75] Inventor: Gurtej Singh Sandhu, Boise, Id.

[73] Assignee: Micron Technologies, Inc., Boise, Id.

[21] Appl. No.: 08/580,457

[22] Filed: Dec. 26, 1995

[51] Int. Cl.[7] .................................................. H01L 23/48
[52] U.S. Cl. ........................... 257/751; 257/762; 257/763
[58] Field of Search ................................... 257/751, 762, 257/763

[56] References Cited

U.S. PATENT DOCUMENTS

| | | | |
|---|---|---|---|
| 4,910,169 | 3/1990 | Hoshino | 437/198 |
| 5,130,274 | 7/1992 | Harper et al. | 437/195 |
| 5,818,109 | 10/1998 | Satake | 257/751 |

*Primary Examiner*—Roy Potter
*Attorney, Agent, or Firm*—Reed Smith Shaw & McClay LLP

[57] ABSTRACT

In a method for fabricating an integrated circuit interconnect upon a semiconductor substrate an integrated circuit component is formed upon the surface of the semiconductor substrate. A copper interconnect is formed and electrically coupled to the integrated circuit component. A metal is introduced in the copper interconnect to provide an introduced metal. A gas is reacted with the implanted metal to form a barrier layer cladding upon the copper interconnect. The metal is introduced substantially near the surface of the copper interconnect and substantially all of the introduced metal diffuses to the surface and reacts with the gas. Thus the resistivity of the introduced interconnect is substantially equal to the resistivity of copper. The metal can be, for example, titanium, tantalum, chromium, aluminium or tungsten. The gas can contain, for example, nitrogen, oxygen and carbon.

12 Claims, 2 Drawing Sheets

BARRIER LAYER CLADDING AROUND COPPER INTERCONNECT LINES

BACKGROUND OF THE INVENTION

1. Field of the Invention

This invention relates to the field of semiconductor integrated circuit fabrication and, in particular, to the fabrication of electrical interconnects on semiconductor integrated circuits.

2. Background Art

It is well known to use metal films in semiconductor integrated circuit technology in order to electrically couple various components formed on semiconductor wafers. Copper is the preferred metal material for forming integrated circuit metallization including small geometry high density integrated circuit metallization. It is preferred primarily because of its very low resistivity and, therefore, its small RC time constant. Low resistivity is particularly important in small geometry integrated circuit metallization because the thickness of metallization must be decreased in small geometries. However, decreases in the thickness of metallization increase resistance. Additionally, copper has a high resistance to electromigration and high thermal conductivity. However, a number of issues must be addressed before copper can be reliably used in very small integrated circuit geometries.

A serious problem with the use of copper in small circuit geometries is that copper is highly diffusive through silicon and silicon based interlevel dielectric materials. This permits copper atoms from copper interconnects to reach nearby transistors in small circuit geometries, and change the electrical properties of the transistors.

A barrier cladding layer on the surface of the copper metallization can be used to prevent the unwanted copper diffusion into the silicon. One material which effectively serves as a cladding layer on copper to prevent diffusion is titanium nitride (TiN). For example, J. Li, J. W. Mayer, in "Advanced Metallization for ULSI Applications," 1992, proceedings of the conference held Oct. 20–22, 1992, in Tempe, Ariz., sponsored by Continuing Education in Engineering, University Extension, University of California, Berkeley, Calif., U.S.A.; editors, Timothy S. Cale, Fabio S. Pintchovski; Pittsburgh, Pa., Materials Research Society, a method for forming such a barrier cladding layer formed of titanium nitride is taught.

In the method taught by Li, et al., a copper titanium alloy is heat treated in ambient ammonia or nitrogen plasma. When the alloy is heated to approximately 450° C., the titanium near the surface of the film diffuses to the surface and reacts with nitrogen to form the titanium nitride layer. The titanium nitride layer formed on the metallization in this manner is an effective barrier to copper diffusion. However, the bulk resistivity of the copper titanium alloy forming the metallization is too high for the alloy to be used as metallization in integrated circuits.

Other methods for forming titanium nitride layers to act as diffusion barriers are known. For example, Gonzales in "Integrated Process for Fabricating Raised, Source/Drain, Short-Channel Transistors," issued on May 17, 1987, as U.S. Pat. No. 5,312,768, teaches a method for depositing titanium nitride on a surface by chemical vapor deposition. The titanium nitride taught by Gonzales acts as a diffusion barrier to prevent migration of dopant ions into the source, drain and gate of transistors where they would degrade the voltage characteristics of the transistor.

Additionally, Sandhu, in U.S. Pat. No. 5,252,518, issued Oct. 12, 1993, teaches the use of titanium nitride as part of metallization schemes for many large scale integrated circuit applications. For example, Sandhu teaches the use of titanium nitride as protection against spiking of aluminum contacts to silicon. However, neither the Gonzales reference nor the Sandhu reference teaches a method for using the titanium nitride material to clad copper interconnect lines and thereby prevent diffusion of copper from integrated circuit interconnect lines into adjacent silicon structures.

It is therefore an object of the present invention to provide improved metallization within high density integrated circuits.

It is a further object of the present invention to provide a method for preventing diffusion of copper from copper metallization while providing metallization of very low resistivity.

It is a further object of the present invention to provide an improved method for preventing diffusion of copper from copper integrated circuit metallization into surrounding silicon materials.

These and other objects of the present invention will become more fully apparent from the description and claims that follow or may be learned by the practice of the invention.

SUMMARY OF THE INVENTION

In a method for fabricating an integrated circuit interconnect upon a semiconductor substrate an integrated circuit component is formed upon the surface of the semiconductor substrate. A copper interconnect is formed and electrically coupled to the integrated circuit component. A metal is introduced into the copper interconnect to provide an introduced metal. A gas is reacted with the introduced metal to form a barrier layer cladding upon the copper interconnect. The metal is introduced substantially near the surface of the copper interconnect and substantially all of the introduced metal diffuses to the surface of the copper interconnect and reacts with the gas. Thus the resistivity of the interconnect is substantially equal to the resistivity of copper.

BRIEF DESCRIPTION OF THE DRAWINGS

In order that the manner in which the above recited and other advantages and objects of the invention are obtained can be appreciated, a more particular description of the invention briefly described above is rendered by reference to a specific embodiment thereof which is illustrated in the appended drawings. Understanding that these drawings depict only a typical embodiment of the invention and are therefore not to be considered limiting of its scope, the invention and the presently understood best mode thereof are described and explained with additional specificity and detail through the use of the accompanying drawings.

DETAILED DESCRIPTION OF THE INVENTION

Figure 1:
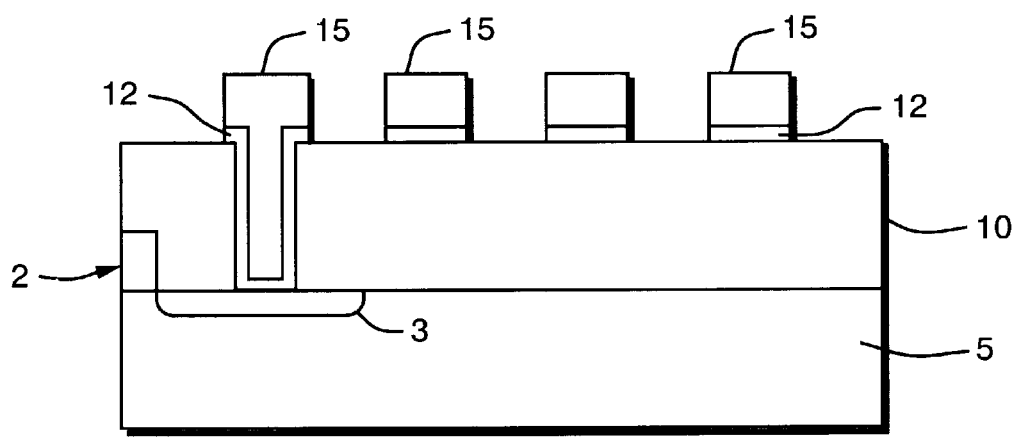
FIG. 1 shows a cross-sectional representation of electrical interconnects for the formation of a barrier layer cladding upon the electrical interconnects according to the method of the present invention.

Referring now to FIG. 1, there is shown a cross-sectional representation of electrical interconnects 15 formed upon interlevel dielectric oxide 10 which is located upon semiconductor substrate 5. Electrical interconnects 15 can have a height of one-half micron, a width of one-half micron and a spacing of one-half micron between adjacent electrical interconnects 15. Electrical interconnects 15 formed with these dimensions have an aspect ratio of one, as shown in the drawings for the purpose of illustration.

However, it will be understood that the method of the present invention can be performed upon electrical interconnects of any size, spacing and aspect ratio. Furthermore, electrical interconnects 15 formed according to the present invention can be electrically coupled to any integrated circuit component. For example, they can be electrically coupled to diffusion region 3 of transistor 2 upon semiconductor substrate 5 by way of an opening through interlevel dielectric oxide 10.

Electrical interconnects 15 are formed of copper and adapted to be suitable for use in any kind of semiconductor integrated circuit. In particular, however, electrical interconnects 15 of the present invention are adapted to be advantageously applied to semiconductor integrated circuits having substantially high circuit densities because they can be located near integrated circuit components without outdiffusion of copper from interconnects 15 to the nearby components. Such a diffusion of copper to a nearby component would change the electrical characteristics of the component.

It is well known that the copper forming electrical interconnects 15 is highly diffusive in silicon and many silicon containing materials. Therefore, barrier layers 12 are provided between electrical interconnects 15 and the surfaces of interlevel dielectric oxide 10. Barrier layers 12 block diffusion of copper from electrical interconnects 15 into interlevel dielectric oxide 10. Barrier layers 12 can be conventional barrier layers formed by any known method such as sputtering or chemical vapor deposition. Barrier layers 12 can, for example, be formed of a nitride, an oxide or a carbide.

Figure 2:
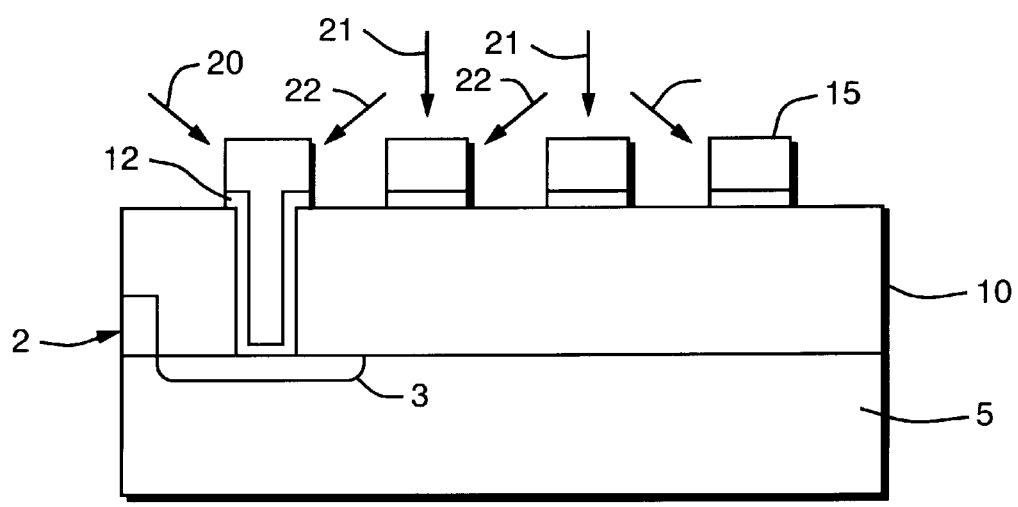
FIG. 2 shows a cross-sectional representation of electrical interconnects for introducing a metal for formation of a barrier layer cladding upon the electrical interconnects according to the method of the present invention.

Referring now to FIG. 2, a metal is introduced into electrical interconnects 15 as indicated by arrows 20, 21, 22. The introducing of a metal into electrical interconnects 15 can be performed by means of any conventional technique effective to embed or insert the metal into interconnects 15. For example, the introducing can be performed by a plasma immersion technique in which substrate 5 is biased in order to accelerate ions into interconnects 15. In the preferred embodiment of the invention a conventional implant is performed and the introduced metal is titanium. However, other metals in addition to titanium can be used as the introduced metal. For example, tantalum, tungsten, chromium and aluminum can be used.

When the metal is introduced into electrical interconnect 15 by implantation, the metal implant is a high angle implant. When metal is implanted into electrical interconnect 15 the implant is preferably performed at an angle as close as possible to ninety degrees with respect to the implanted surface of electrical interconnect 15. For example, the metal implant into the upper surfaces of electrical interconnects 15, as indicated by arrows 21, can be performed at an angle substantially equal to ninety degrees with respect to the upper surfaces of interconnects 15.

However, the metal implants into the left sides of electrical interconnects 15, as indicated by arrows 20, are performed at an angle of, at least, forty-five degrees with respect to the implanted left surfaces. Because of the aspect ratio of electrical interconnects 15 shown for the purpose of illustration, metal implants at angles less than forty-five degrees are blocked by adjacent electrical interconnects 15. Similarly, the metal implant into the right sides of electrical interconnects 15, as indicated by arrows 22, can be at an angle of, at least, forty-five degrees with respect to the implanted right side surfaces.

Thus the substantially high angle of the metal implant of the method of the present invention is preferably as close to ninety degrees as possible. However, it can be limited, for example, by the aspect ratio of electrical interconnects 15. It can also be limited by the presence of other structures that can be located upon semiconductor substrate 5.

It will be understood by those skilled in the art that the metal introduced into electrical interconnects 15 in this manner is introduced substantially close to the surface of interconnects 15 by whichever method for introducing the metal is selected. Specifically, it is preferred that substantially all of the introduced metal be located within a depth of approximately one hundred angstroms to approximately one thousand angstroms from the surface of electrical interconnects 15.

The energy used to introduce the metal into electrical interconnects 15 is selected to be the energy level that is effective to embed whichever metal is used to the desired depth between one hundred angstroms and one thousand angstroms inside the surface of copper interconnects 15. For example, the energy required to implant titanium one hundred angstroms into a copper surface can be approximately twenty-five KeV. Those skilled in the art can readily make this energy level determination for each metal and for each depth within electrical interconnects 15.

Figure 3:
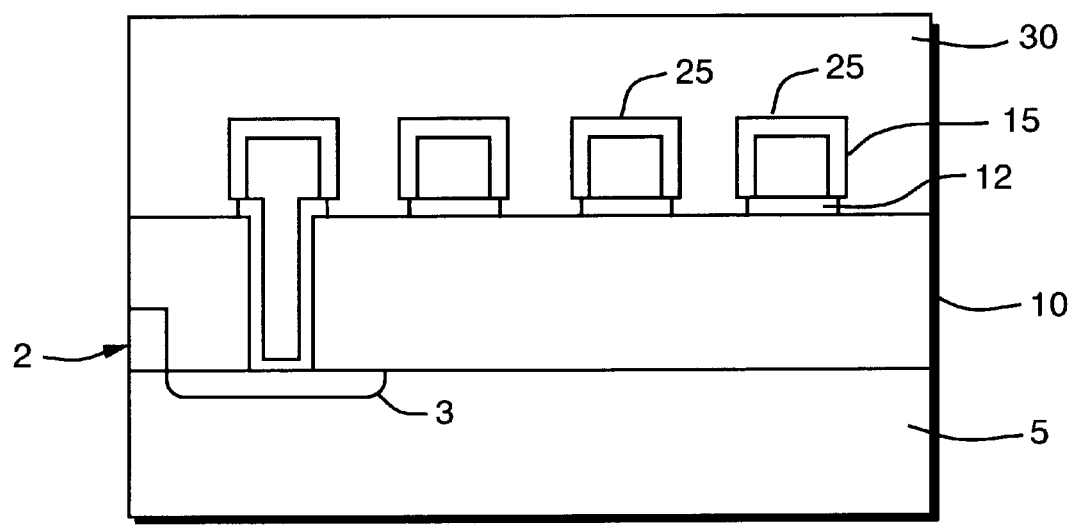
FIG. 3 shows a cross-sectional representation of electrical interconnects having the barrier layer cladding of the method of the present invention.

Referring now to FIG. 3, a gas is applied to electrical interconnects 15 and an anneal step is performed. The gas can be, for example, a nitrogen containing gas, an oxygen containing gas, or a carbon containing gas. The anneal step causes the nitrogen atoms in a nitrogen containing gas, the oxygen atoms in an oxygen containing gas, or the carbon atoms in a carbon containing gas to react with the implanted metal within electrical interconnects 15. The nitrogen containing gas can be ammonia ambient, nitrogen plasma or any other nitrogen containing gas or nitrogen containing plasma. Likewise, the oxygen and carbon containing gases can be any suitable oxygen or carbon containing gas or plasma.

In the case of a titanium implant, the temperature required for the reaction with a nitrogen containing gas can be within a wide range. Temperatures from about 400° C. to about 800° C. are effective for this purpose. The preferred temperature for performing the reaction of the titanium with the nitrogen containing gas is in excess of 450° C. Preferred anneal temperatures for the other metals and the other gases and plasmas can be readily determined by those skilled in the art in accordance with conventional calculations of the temperature required to cause the selected reaction to proceed.

During the anneal reaction substantially all of the metal introduced into electrical interconnects 15 diffuses to the surface of electrical interconnects 15. At the surface of electrical interconnects 15, substantially all of the introduced metal reacts with the gas to form barrier layer cladding 25. Thus the resistivity of electrical interconnects 15 is substantially equal to the resistivity of substantially pure copper. For example, in the case in which titanium is introduced into electrical interconnects 15, annealing with a nitrogen containing gas causes substantially all of the titanium to diffuse from interconnects 15 and form barrier layer cladding 25 of titanium nitride. Similarly, substantially all of the introduced tantalum, tungsten, chromium, aluminum or other metal diffuses out of interconnects 15 and forms a barrier cladding layer 25 formed of an oxide or carbide if interconnects 15 are annealed with oxygen containing gas or carbon containing gas.

In this manner barrier layer cladding 25 is formed on the surface of electrical interconnects 15. Preferably, the thickness of barrier cladding layer 25 can be between approximately one hundred angstroms and five hundred angstroms. Barrier layer cladding 25 is effective to prevent diffusion of copper from electrical interconnects 15 into silicon containing materials later formed adjacent electrical interconnects 15.

It will be understood by those skilled in the art that any metal introduced into interlevel dielectric oxide 10 does not diffuse in interlevel dielectric oxide 10 or other dielectric materials that can be used to form oxide 10. Furthermore, reactants from the gas applied during the anneal step for reaction with the introduced metal do not diffuse through interlevel dielectric oxide 10. Thus, nitrides, oxides and carbides do not form on interlevel dielectric oxide 10. However, a thin surface layer of interlevel dielectric oxide 10 can be selectively wet etched to remove any unwanted introduced metal from the surface without disturbing the copper of interconnects 15. Layer 30 can then be formed over electrical interconnects 15. Layer 30 can be, for example, a nitride, a silicon oxide or an organic dielectric.

It is to be understood that although the present invention has been described with reference to a preferred embodiment, various modifications, known to those skilled in the art, can be made to the structure and process steps presented herein.

What is claimed is:

1. A semiconductor integrated circuit formed upon a semiconductor substrate, comprising:

an integrated circuit component formed upon a surface of said semiconductor substrate;

a copper interconnect having a bottommost surface electrically coupled to said integrated circuit component, an uppermost surface at an end opposing the bottommost surface, a left side surface which extends along one edge of said copper interconnect between the bottommost surface and the uppermost surface, and a right side surface which extends along an edge opposite the left side surface between the bottommost surface and the uppermost surface; and an ion-implanted metal barrier layer cladding which, at formation, is driven only into the uppermost surface, the left side surface, and the right side surface of said copper interconnect, and which ion-implanted metal is annealled out of said copper interconnect after formation, wherein said ion-implanted metal barrier layer extends only to the uppermost surface, the left side surface, and the right side surface after said ion-implanted metal barrier layer is annealed.

2. The semiconductor integrated circuit of claim 1, wherein said ion-implanted metal barrier layer cladding is an anneal of said introduced metal and a nitrogen containing gas.

3. The semiconductor integrated circuit of claim 2, wherein said ion-implanted metal barrier layer cladding is an anneal of said introduced metal and ammonia.

4. The semiconductor integrated circuit of claim 2, wherein said ion-implanted metal barrier layer cladding is an anneal of said introduced metal and nitrogen plasma.

5. The semiconductor integrated circuit of claim 2, wherein said ion-implanted metal barrier layer cladding is an anneal of said introduced metal and said nitrogen containing gas at a temperature greater than approximately 400° C.

6. The semiconductor integrated circuit of claim 1, wherein said introduced metal comprises titanium.

7. The semiconductor integrated circuit of claim 1, wherein said introduced metal comprises tantalum.

8. The semiconductor integrated circuit of claim 1, wherein said introduced metal comprises chromium.

9. The semiconductor integrated circuit of claim 1, wherein said introduced metal comprises aluminum.

10. The semiconductor integrated circuit of claim 1, wherein said introduced metal comprises tungsten.

11. The semiconductor integrated circuit of claim 1, wherein said ion-implanted metal barrier layer cladding is an anneal of said introduced metal and an oxygen containing gas.

12. The semiconductor integrated circuit of claim 1, wherein said ion-implanted metal barrier layer cladding is an anneal of said introduced metal and a carbon containing gas.

* * * * *